United States Patent [19]

Shimizu et al.

[11] 3,918,004

[45] Nov. 4, 1975

[54] DIFFERENTIAL AMPLIFIER CIRCUIT

[75] Inventors: Ikuo Shimizu; Hiroshi Furuno; Ryuji Oki, all of Tokyo, Japan

[73] Assignee: Sony Corporation, Tokyo, Japan

[22] Filed: Sept. 9, 1974

[21] Appl. No.: 504,291

[30] Foreign Application Priority Data

Sept. 11, 1973 Japan .............................. 48-106381

[52] U.S. Cl. .......... 330/30 D; 307/299 A; 330/38 M

[51] Int. Cl.$^2$ ............................................ H03F 3/45

[58] Field of Search ..... 330/30 D, 38 M; 307/299 A

[56] References Cited

UNITED STATES PATENTS 3,700,921 10/1972 Gay .......................... 307/299 B UX 3,819,955 6/1974 Hilbert .......................... 330/30 D X

*Primary Examiner*—James B. Mullins

*Attorney, Agent, or Firm*—Lewis H. Eslinger, Esq.; Alvin Sinderbrand, Esq.

[57] ABSTRACT

A differential amplifier circuit consists of first and second differentially-connected transistor sections, each having a base, emitter, and collector. The emitter junction area of one of the transistor sections is different from that of the other transistor sections, and a resistor is connected between the bases of the transistors.

5 Claims, 3 Drawing Figures

DIFFERENTIAL AMPLIFIER CIRCUIT

BACKGROUND OF THE INVENTION

1. Field of the Invention

The present invention relates generally to a differential amplifier circuit and more particularly to a differential circuit in which the emitter junction area of one differentially-connected transistor section is made greater than that of the other differentially-connected transistor section.

2. Description of the Prior Art

In a simple differential amplifier consisting of two differentially-connected transistors having their emitter terminals connected together and connected to ground by a constant current circuit, and with an input to one transistor and a fixed bias to the other, it has not been possible to obtain an exact balance between the collector currents of the two transistors. This is especially true in a differential amplifier formed as an integrated circuit, one reason being that the types of electrical components that can be used in such circuits are, as a practical matter, limited.

Accordingly, it is one object of the present invention to provide an improved differential amplifier that achieves more perfect balance between the differentially connected transistor sections.

Another object of the invention is to provide a differential amplifier in which a bias voltage applied to the differentially-connected transistors improves the balance between these transistors.

A further object of the invention is to provide a differential amplifier having a high impedance and capable of being formed as an integrated circuit.

Further objects will be apparent after studying the following specification together with the drawings.

SUMMARY OF THE INVENTION

In accordance with the present invention, there is provided a differential amplifier circuit which includes first and second differentially-connected transistor sections and in which the emitter junction areas of the transistor sections are different. A constant current source is connected to the emitters of the differentially-connected transistor sections, and a resistor is connected between the bases of the differentially-connected sections.

DESCRIPTION OF THE PREFERRED EMBODIMENTS

Figures 1, 2, 3:
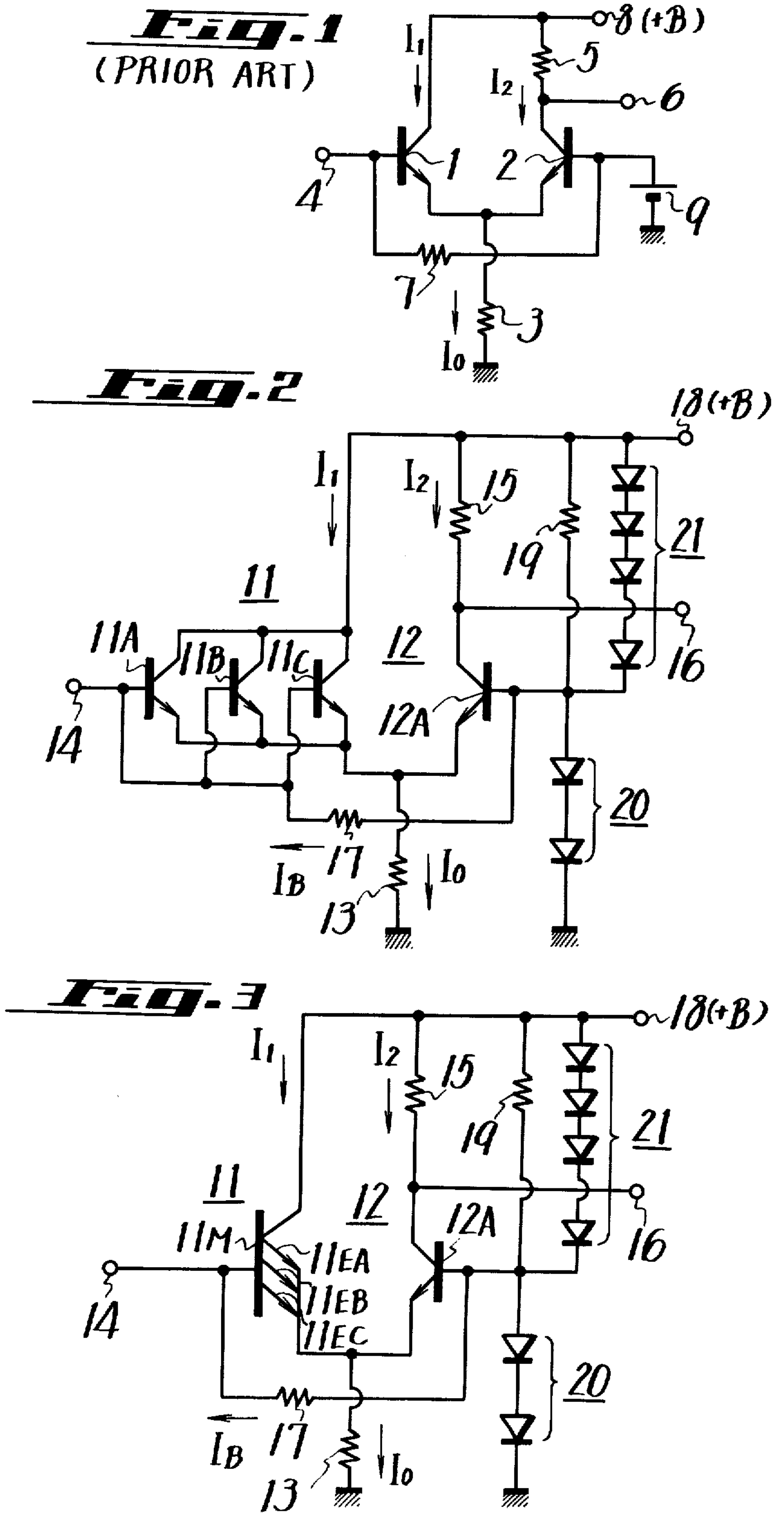
FIG. 1 is a circuit diagram showing a prior art differential amplifier.
FIG. 2 is a schematic circuit diagram showing one embodiment of a differential amplifier circuit according to the present invention.
FIG. 3 is a schematic circuit diagram showing another embodiment of the invention.

The prior art circuit in FIG. 1 shows a differential amplifier that includes a pair of transistors 1 and 2 the emitters of which are connected together to a constant current source, such as a resistor 3. The circuit has an input terminal 4 connected to the base of the first transistor 1, a load resistor 5 connected to the collector of the second transistor 2, and an output terminal 6 connected to the juncture of the load resistor 5 and the collector of the transistor 2. In order to increase the input impedance of the differential amplifier circuit and to apply an input signal in opposite phase to the bases of the transistors 1 and 2, it is necessary to insert a resistor 7 between the bases of the transistors 1 and 2. The collector of the transistor 1 and the load resistor 5 are connected to a voltage source terminal 8 of +B volts. A direct voltage source 9 is connected to the base of the transistor 2 to bias the base of both of the transistors 1 and 2.

If the transistors 1 and 2 are formed as parts of a semiconductor integrated circuit to have substantially the same characteristics and it is assumed that each of the transistors has a current amplification factor $\beta$ and a mutual conductance $g_m$ and that as the base bias current for the transistor 1, which current flows through the resistor 7, is $I_B$ and the DC collector current of the transistor 1 is $I_1$, the relation between $I_B$, $\beta$, and $I_1$ is:

$$I_1 = \beta I_B \qquad (1)$$

If no resistor 7 is provided, i.e., if the bases of the transistors 1 and 2 are connected directly together, the collector current $I_1$ that flows through the transistor 1 is equal to the DC collector current $I_2$ that flows through the transistor 2, or $$I_1 = I_2 \qquad (2)$$

However, when the resistor 7 is provided as shown in FIG. 1, the current $I_1$ becomes:

$$I_1 = I_2 - R_B \cdot g_m \qquad (3)$$

If $I_1/\beta$ from the equation (1) is substituted for $I_B$ in equation (3) and terms are rearranged, the following equation is obtained:

$$\beta I_1 = \beta \cdot I_2 - R_B \cdot I_1 \cdot g_m \qquad (4)$$

The current $I_0$ passing through the resistor 3 is the sum of the current $I_1$ and the current $I_2$. Therefore, $$I_2 = I_0 - I_1 \qquad (5)$$

Equation (4) may be rearranged by substituting equation (5) into it to eliminate $I_2$:

$$I_1 = \frac{\beta}{2\beta + R_B \cdot g_m} I_0 \qquad (6)$$

An exact balance between the currents $I_1$ and $I_2$ in which each of them equals $I_0/2$ can only be obtained by making $\beta$ infinite, and either $g_m$ or $R_B$ zero ($R_B = 0$). However, if $R_B = 0$, which means that the bases of both the transistors 1 and 2 are connected directly together, the circuit cannot operate as an amplifier. Further, since it is impossible to make $\beta$ infinite or $g_m$ zero, it is impossible to keep the transistors 1 and 2 in balance.

In order to avoid such a defect, a coil may be employed in place of the resistor 7. However, such a substitution requires an increased number of terminals when the circuit is made as an integrated circuit.

An embodiment of a differential amplifier circuit according to the present invention is shown in FIG. 2. This circuit includes a pair of active elements or transistor sections that form a differential amplifier. One of the transistor sections 11 is formed, for example, of three transistors 11A, 11B, and 11C, the bases, emitters and collectors of which are connected in parallel with one another, while the other active element, or transistor section 12 is formed of a single transistor 12A in the illustrated embodiment. The emitters of the transistors 11A, 11B, and 11C in the first transistor section 11 are connected together to the emitter of the transistor 12A in the second transistor section 12 and the juncture among the emitters is grounded through a constant current source, which, in this embodiment, is a resistor 13. An input terminal 14 is connected to the bases of the transistors 11A, 11B, and 11C to apply an input signal thereto, and load resistor 15 and an output terminal 16 are connected to the collector of the transistor 12A. A resistor 17 is connected in series between the base of the transistor 12A and the common connection to the bases of the transistors 11A, 11B, and 11C. A power supply terminal 18 furnishes the +B operating voltage for the transistors. A series circuit comprising a resistor 19 and a plurality of diodes 20 is connected between the voltage source terminal 18 and the ground to supply a bias voltage to the transistor 12A from the juncture between the resistor 19 and the first diode 20. If necessary, a number of diodes 21 may be connected in parallel with the resistor 19.

In the embodiment of the circuit shown in FIG. 2, the transistors 11A, 11B, 11C and 12A have substantially the same characteristics, and these transistors can be made by the same integration process with semiconductor substrates of the same size, shape and characteristics. As a result, the total emitter junction area of the transistors 11A, 11B, 11C in the transistor section 11 is three times as great as the emitter junction area of the transistor 12A in the section 12.

If the base bias current of the transistors 11A, 11B, and 11C, which is the current flowing through the resistor 17, is taken as $I_B$ and the combined DC collector current of the transistors 11A, 11B, and 11C as $I_1$, the current $I_1$ is expressed as follows:

$$I_1 = \beta \cdot I_B \tag{7}$$

If the resistance of the resistor 17 is zero, so that the bases of the transistors 11A, 11B, and 11C in the first section 11 are connected directly to the base of the transistor 12A in the section 12, the DC collector current passing through each of the transistors 11A, 11B, and 11C in the section 11 is equal to the DC collector current passing through the transistor 12A in the outer section 12. Accordingly, if it is assumed that the number of the transistors forming the first section 11 is $n$ (in the illustrated example $n = 3$) and the DC collector current of the transistor forming the other section 12 (in the illustrated example, the single transistor 12A) is taken as $I_2$:

$$I_1 = n \cdot I_2 \tag{8}$$

If the resistor 17 is connected as shown in FIG. 2, and the resistance value of the resistor 17 is taken as $R_B$, the current $I_1$ is expressed as follows:

$$I_1 = n I_2 - R_B I_B g_m \tag{9}$$

If $I_B = I_1/\beta$ derived from equation (7) is substituted into equation (9) and the terms are rearranged, the following equation (10) is derived:

$$\beta I_1 = \beta I_2 - n R_B I_1 g_m \tag{10}$$

The total current $I_0$ flowing through the constant current source or resistor 13 is the sum of the currents $I_1$ and $I_2$, so that:

$$I_2 = I_0 - I_1 \tag{11}$$

Substituting equation (11) into equation (10) to eliminate $I_2$ and rearranging the terms gives:

$$I_1 = \frac{n \beta}{(n+1)\beta + n \cdot R_B \cdot g_m} I_0 \tag{12}$$

As described above, the emitter junction area of the transistors the first section 11 is selected to be greater than that of the transistor in the second section 12. The first section 11 is formed of a plurality $n$ of transistors, in which $n$ is selected to be equal to or greater than 2, i.e. $n \geq 2$, so that if the resistance value $R_B$ is properly selected in relation to the values of $n$, $\beta$ and $g_m$, the relationship $I_1 = I_2 = I_0/2$ can be satisfied, or balance can be obtained between the sections 11 and 12. This requires that:

$$\frac{n \beta}{(n+1)\beta + n R_B \cdot g_m} = \frac{1}{2} \tag{13}$$

Equation (13) can be satisfied by making $$(n-1)\beta = n R_B g_m \tag{14}$$

Substituting $(n - 1)\beta$ for $n R_B g_m$ in equation (13) and expanding the terms in the denominator gives:

$$I_1 = \frac{n\beta}{n\beta + \beta + n\beta - \beta} I_0 = \frac{n\beta}{2n\beta} I_0 = \frac{I_0}{2} \tag{15}$$

Rearranging the terms of equation (14) gives:

$$R_B = \frac{(n-1)\beta}{n g_m} \tag{14'}$$

Accordingly, it will be obvious from equation (14') that if the number of transistors $n$ forming the first section 11 is greater, the resistance value $R_B$ of the resistor 17 can be increased.

Since the differential amplifier circuit according to the invention consists of transistors, resistors and diodes, it can be formed as an integrated circuit easily. In this case, each of the transistors 11A, 11B, and 11C, which form the first section 11, and the transistor 12A, which forms the second section 12, is made as a planar type transistor and the resistor 17 is formed as a squeeze resistor by the same diffusion as that forming the collectors, bases and emitters of the transistors and utilizing the regions corresponding to the base regions thereof. When the resistor 17 is formed in this way, its resistance value $R_B$ is in proportion to the current amplification factor $\beta$ each transistor, so that $R_B = K \cdot \beta$ (where $K$ is a constant) is established. Substituting this value for $R_B$ in the equation (15) gives:

$$K = \frac{n-1}{n g_m} \text{ or } g_m = \frac{n-1}{n K} \tag{16}$$

Thus, if the mutual conductance $g_m$ is selected to have a predetermined value in accordance with the number $n$ of the transistors forming the first section 11, $I_1 = I_0/2$ is obtained independently of the current amplification factor $\beta$ of each transistor.

In the embodiment of FIG. 2, the base bias voltage is held constant by the diodes 20. However, when the voltage of the voltage source is a normal value, a current passes through the resistor 19 and no current flows through the series circuit of the diodes 21. When the voltage of the voltage source exceeds a predetermined value, a current flows through the series circuit of the diodes 21 to keep the operating voltage applied to the differential amplifier constant in cooperating with the diodes 20. Therefore, in forming the circuit it is unnecessary to take into account the possibility that the voltage of the voltage source may be increased abnormally, and hence the circuit can be constructed easily.

Another embodiment of the present will be now described with reference to FIG. 3 in which the elements the same as those used in FIG. 2 are identified by the same reference numerals.

In the embodiment of FIG. 3, a multi-emitter transistor 11M with three emitters 11EA, 11EB, and 11EC is used in place of the three transistors 11A, 11B, and 11C used in the embodiment of FIG. 2 for forming the first differentially-connected transistor section 11. In this case, if each of the emitters of the transistors 11M and 12A is formed to have the same size and shape, the total emitter junction area of the transistor 11M is greater than that of the transistor 12A. The rest of the circuit construction of the embodiment shown in FIG. 3 is substantially the same as that of the embodiment shown in FIG. 2. Thus, the effect performed by the embodiment of FIG. 2 can be also performed by the embodiment of FIG. 3. That is, the collector current $I_1$ of the transistor 11M is substantially equal to the total emitter currents of the three emitters 11EA, 11EB, and 11EC. Accordingly, if the emitter current of each of the emitters 11EA, 11EB, and 11EC of the transistor 11M is taken as $I_{E1}$, the following equation (8') is obtained:

$$n \cdot I_{E1} \approx I_1 = n \cdot I_2 \quad (8')$$

Thus, in the embodiment of FIG. 3, the equation (9) and those following thereto can be also applied to the embodiment of FIG. 3.

The above description is given for the case in which the emitter junction area of the transistors that form the first and second sections is selected to be substantially equal and the members of the transistors of the two sections are selected to be different, but it may be obvious that, in the case of forming both differentially-connected sections of a differential amplifier with one transistor, respectively, the emitter junction area of one transistor is selected to be greater than that of the other transistor for achieving the same effect.

As described above, with the differential amplifier according to the present invention, the balance between the two sections thereof can be easily held and the circuit can be easily formed as an integrated circuit. In this case, since there is no requirement for an external element such as a coil, to be attached to the integrated circuit from the outside, the number of terminals is not increased, and even if one of the sections is formed of a plurality of transistors, no additional manufacturing processes are required. As a result, the circuit can be made at low cost.

It is apparent that many variations and modifications could be effected by one skilled in the art without departing from the spirit and scope of the novel concepts of the present invention.

What is claimed is:

1. A balanced differential amplifier circuit comprising:

A. a first section comprising first transistor means having base, emitter and collector electrodes;

B. a second section differentially-connected with respect to said first section and comprising second transistor means having base, emitter and collector electrodes, the effective emitter junction area of one of said first and second transistor means being larger than the effective emitter junction area of the other transistor means by a factor n;

C. means for applying bias potentials to the base electrodes of said transistor means; and D. a resistor connected between base electrodes of said transistor means of said first and second sections, said resistor having a resistance value which is a function of said factor n, so that the current flowing through said first section is equal to the current flowing through said second section in the absence of an input signal applied thereto.

2. A balanced differential amplifier circuit according to claim 1 in which said first transistor means comprises a plurality of parallel-connected transistors $n$ times as great in number than said second transistor means.

3. A balanced differential amplifier circuit according to claim 1 in which said first section comprises a multi-emitter type transistor having $n$ times as many emitters as the second transistor means.

4. A balanced differential amplifier circuit according to claim 1 in which said resistor is a squeeze resistor.

5. A balanced differential amplifier circuit comprising:

A. first and second differentially-connected sections, each comprising transistor means comprising base, emitter and collector electrodes, the effective emitter junction area of one of said transistor means being larger than the effective emitter junction area of the other transistor means by a factor n;

B. means for supplying an input signal to the base of the transistor means of said first section;

C. means for connecting the emitters of the transistors of said first and second sections with each other;

D. output terminal means for deriving an output signal from the collector electrode of the transistor of one of said first and second sections;

E. connecting means comprising a resistor connected in series between the base electrodes of the transistor means of said first and second sections, said resistor having a resistance value equal to $(n-1)\beta/ng_m$, where $\beta$ is the amplification factor of each transistor means and $g_m$ is the mutual conductance of each transistor means; and F. biasing means connected to the base electrode of the transistor means of one of said first and second sections and for applying a bias voltage to both transistor means of said first and second sections.

* * * * *

UNITED STATES PATENT OFFICE

CERTIFICATE OF CORRECTION

Patent No. 3,918,004 Dated November 4, 1975

Inventor(s) Ikuo Shimizu, Hiroshi Furuno, Ryuji Oki

It is certified that error appears in the above-identified patent and that said Letters Patent are hereby corrected as shown below:

Column 2, line 27 "$I_1=I_2-R_B \cdot g_m$" to --$I_1=I_2-R_B \cdot I_B \cdot g_m$--

Column 3, line 35 "outer" should be --other--

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*